United States Patent [19]

Sakurai

[11] 4,251,828

[45] Feb. 17, 1981

[54] SEMICONDUCTOR DEVICE AND PROCESS FOR PRODUCING THE SAME

[75] Inventor: Junji Sakurai, Tokyo, Japan

[73] Assignee: Fujitsu Limited, Kawasaki, Japan

[21] Appl. No.: 912,736

[22] Filed: Jun. 5, 1978

[30] Foreign Application Priority Data

Jun. 3, 1977 [JP] Japan .................................. 52-65455

[51] Int. Cl.³ .......................................... H01L 29/78
[52] U.S. Cl. ...................................... 357/23; 357/52;
357/53; 357/55; 357/56; 357/59
[58] Field of Search ....................... 357/23, 59, 52, 53, 357/55, 56

[56] References Cited

U.S. PATENT DOCUMENTS 4,041,518 9/1977 Shimizu et al. ......................... 357/59

OTHER PUBLICATIONS

I.E.D.M: Tech. Digest (1973)-pp. 244–247.

Primary Examiner—Edward J. Wojciechowicz
Attorney, Agent, or Firm—Staas & Halsey

[57] ABSTRACT

An improvement for preventing a short circuit between the source and drain regions of an MOS type semiconductor device. The source and drain regions are placed on an insulating layer to reduce the junction capacitance between these layers and a semiconductor substrate in the MOS type semiconductor device. The polycrystalline silicon, which was present in the conventional device between the source and drain regions, and thus caused the short, is changed by the improvement to an insulating material. Disclosed also herein is an advantageous process for producing the semiconductor device.

17 Claims, 27 Drawing Figures

SEMICONDUCTOR DEVICE AND PROCESS FOR PRODUCING THE SAME

BACKGROUND OF THE INVENTION

1. Field of the Invention

The present invention relates to a semiconductor device, more particularly an MOS (metal oxide semiconductor) type device, as well as the process for producing to a same.

2. Description of the Prior Art

The conventional MOS type device comprises a P (or N) type semiconductor substrate, with N(P) type semiconductor regions on the substrate and an oxide layer placed on a part of the P(N) type semiconductor substrate. An N(P) type semiconductor region is established under the oxide layer by inversion and is used for a channel region. By placing suitable materials for electrodes on exposed parts of the N(P) type semiconductor regions, one of these regions is used for a source region and the other region is used for a drain region.

According to a recently developed MOS type field effect transistor with an aluminum gate, an insulating layer is buried under the semiconductor layer below the source and drain regions (IEEE TRANSACTION OF ELECTRON DEVICES, OCTOBER, 1976, pages 1190 and 1191). This buried insulating layer, which is formed by thermal oxidation of the silicon substrate, is located usually below the entire semiconductor layer except for the channel region of the transistor, and in the proximity of the channel region. The transistor with such a buried insulating layer has an excellent high frequency property. This is because the junction capacitance between the P(N) type semiconductor substrate and the N(P) type semiconductor layer of the source and drain regions is reduced because the N(P) type semiconductor layers are placed on the insulating layer.

It is known from the published Japanese Patent Specification No. 50-13154 and from U.S. Pat. No. 3,600,651 that the buried insulating layer is placed on the entire silicon substrate except for a channel region of the MOS type field effect transistor. Since the source and drain regions and their surrounding portions are formed entirely on the buried insulating layer, the junction capacitance is reduced further than it would be by the MOS type field effect transistor known from the publication mentioned above.

The structure of the MOS type field effect transistor having a buried insulating layer will now be illustrated in detail with reference to FIGS. 1(a), (b) and (c).

Referring to FIG. 1 showing a cross sectional view of the MOS type field effect transistor, the insulating layer 2 consisting of silicon dioxide is formed on the P(N) type semiconductor substrate 1 and has a window to expose a part of the substrate, on which part the single-crystalline epitaxial silicon layer 3 is placed. This silicon layer 3 is provided with a P−(N−, the minus sign indicating low conductivity) conductivity when epitaxially grown on the P(N) type silicon substrate 1. The the silicon layer 3 is first deposited on the entire top surface of both the exposed substrate 1 and the silicon dioxide layer 2, but a peripheral part of the deposited silicon becomes polycrystalline. This part is shown in FIGS. 1(a) and (b) as a part of the polycrystalline silicon layer 4a and 4b, which is deposited on the silicon dioxide layer 2. The polycrystalline silicon of the layer 4a and 4b is doped with the N(P) type impurity and has N+(P+, the plus sign indicating high conductivity) type conductivity. A circumferential part of the single-crystalline silicon layer 3 is changed to N(P) type conductivity by the N(P) type impurity of the polycrystalline silicon layer 4a and 4b, and therefore, is numbered as 3b and 3c so as to distinguish it from the original P(N) type layer 3a. Exposed parts of the silicon substrate 1 are also changed to N(P) type conductivity, and therefore, are denoted as 1b and 1c, so as to distinguish them from the silicon substrate 1a having the original P(N) conductivity. The silicon dioxide layer 5, surrounds the polycrystalline silicon layer 4. The P(N) type polycrystalline silicon layer 6 of a gate is formed on the thin insulating film 7 comprising for example, silicon dioxide, which is formed on the single-crystalline silicon layer 3. The PSG (phosphosilicate glass) layer 8 having windows covers the entire surface of the MOS transistor and metallic electrodes 9 and 10 are brought into ohmic contact with the polycrystalline silicon layers 4a and 4b, respectively, through the windows.

The source region is established in the polycrystalline silicon layer 4a, single-crystalline silicon layer 3b and the silicon substrate 1b. Similarly, the channel region is established in the top part of the P(N) type silicon layer 3a. The drain region is established in the polycrystalline silicon layer 4b, single-crystalline silicon layer 3c and the silicon substrate 1c. Since the polycrystalline silicon layers 4a and 4b are separated from the substrate 1 by the silicon dioxide layer 2, the junction capacitance mentioned above is very much reduced.

The planar relationship between each of the source, channel and drain regions will be apparent from FIG. 1(c). The rectangular area surrounded by the line $L_{4a}$ corresponds to the exposed part of the polycrystalline silicon layer 4a. The metal wire 9 extends over the top of the transistor. The area surrounded by the solid line $L_s$ corresponds to the source region, which is established in the N(P) type silicon layers 4a and 3b. The rectangular area surrounded by the line $L_{4b}$ corresponds to the exposed part of the polycrystalline silicon layer 4b. The metal wire 10 extends from the exposed area of the silicon layer 4b. The area surrounded by the solid line $L_d$ corresponds to the drain region, which is established in the N(P) type silicon layers 4b and 3c. The area surrounded by the line $L_G$ corresponds to the limits of the polycrystalline silicon gate electrode 6, which is exposed at the area surrounded by the line $L_6$. The metal wire 11 extends from the exposed area of the silicon gate electrode 6, surrounded by the line $L_6$. The channel region established below the silicon dioxide film 7 is indicated in FIG. 1(c) by all the broadly spaced diagonal lines. The source region ($L_s$), the channel region and the drain region ($L_d$) are, therefore, successively connected. The metal wires 9, 10 and 11 electrically connect the source and drain regions, and the silicon gate electrode respectively.

A disadvantage of the known MOS type transistor having the buried silicon dioxide layer 2 will be apparent from FIG. 1(b), which is a cross sectional view of FIG. 1(a) along the line (b)—(b) in FIG. 1(c). The channel region is established in the P(N) type single-crystalline silicon layer 3a having a trapezoidal cross section. The width of the bottom of the trapezoidal silicon layer 3a is equal to the width $W_{ox}$ of the window in the buried silicon dioxide layer 2. Parts of the silicon layers which are deposited on the exposed and oxidized part of the silicon substrate become polycrystalline, as denoted in FIG. 1(c) as 4d and 4e. It is to be noted that a part of the silicon deposited on the substrate 1 becomes single-crystalline layer 3a and the other part becomes polycrystalline, as explained with reference to FIG. 1(a). When the polycrystalline silicon layer, except for the layers 4a and 4b, is oxidized to the silicon dioxide layer 5, both the single-crystalline silicon layer 3a of the channel region and the polycrystalline silicon layers 4d, 4e are masked by the thin silicon dioxide layer 7 having a width $W_G$. The polycrystalline silicon layers 4d and 4e are, therefore, left non-oxidized, as shown in FIG. 1(b).

Since the diffusion constant of an impurity in polycrystalline silicon is greater than in single-crystalline silicon, the impurities for doping into the source and drain regions $L_s$ and the $L_d$, respectively, (FIG. 1 (c)) are rapidly diffused into the polycrystalline silicon layers 4d and 4e, which are shown with the narrowly spaced diagonally lines in FIG. 1 (c). The polycrystalline, doped silicon layers 4d and 4e extend through the MOS transistor, as shown in the narrowly hatched areas of FIG. 1(c), and the a short between the source region ($L_s$) and the drain region ($L_d$) occurs due to the polycrystalline silicon layers or passages 4d and 4e running therebetween. The production yield of the MOS type semiconductor device having the buried insulating layer is low.

SUMMARY OF THE INVENTION

It is, therefore, an object of the present invention to provide an MOS type semiconductor device having a buried insulating layer and, also, having such a structure which prevents a short between the source and drain regions.

It is another object of the present invention to improve the withstand voltage of the MOS type semiconductor device against a reverse bias.

It is a further object of the present invention to provide a process for producing an MOS type semiconductor device, which process can simply and reliably prevent a short between the source and drain regions.

It is still another object of the present invention to increase the production yield of the MOS type semiconductor device having an excellent high frequency property.

In accordance with the objects of the present invention there is provided a semiconductor device comprising:

- a semiconductor substrate having a first conductivity type;
- a first insulating layer covering said semiconductor substrate and provided with a window which selectively exposes a portion of the semiconductor substrate;
- an integral semiconductor layer formed on the exposed portion of the semiconductor substrate and on the first insulating layer;
- a second insulating layer, formed on a portion of the semiconductor layer above the exposed portion of the semiconductor substrate, having a thin thickness suited for establishing a channel region thereunder;
- a gate electrode located on the second insulating layer;
- a source region and a drain region comprising two portions of the semiconductor layer, respectively, which two portions have a second conductivity type opposite to said first conductivity type and are extended generally symmetrically along a first direction from below both the second insulating layer and the gate electrode to respective positions above the first insulating layer;
- a channel region established in a portion of the semiconductor layer between the source and drain regions; and
- a source electrode and a drain electrode electrically connected to the two portions of the semiconductor layer, respectively;

characterized in that the width of the second insulating layer is smaller than the width of the portion of the semiconductor layer in contact with the exposed part of the semiconductor substrate, these widths being measured in the direction perpendicular to said first direction of extension.

The semiconductor device advantageously comprises two insulating portions, which are extended in the first direction mentioned above, along the two sides of said channel region shown near the top and bottom of the oxide window region in FIG. 1(b). These insulating portions are essentially thicker than the second insulating layer. In accordance with a preferred embodiment of the present invention, two sides of the channel region may comprise insulating portions with essentially the same thickness as said second insulating layer.

In accordance with an embodiment of the semiconductor device, this device comprises two insulating portions, which are extended in the first direction of extension mentioned above, and which are placed between the channel region and the end of both the first insulating layer and the semiconductor layer placed on the first insulating layer. More specifically, the insulating portions, mentioned above, are formed between one inclined side of the tapered single-crystalline silicon layer of the channel region and the end of both the first insulating layer of silicon dioxide and the first polycrystalline silicon layer.

An embodiment of the MOS type semiconductor device will now be explained in detail in reference to FIG. 2, which indicates the cross sectional structure of an MOS transistor according to an embodiment of the present invention. The cross sectional direction of FIG. 2 is the same as that of FIG. 1(b). The cross sectional structure of the MOS transistor according to an embodiment of the present invention in the cross sectional direction of (a)—(a) in FIG. 1(c) is the same as that shown in FIG. 1(a).

In FIG. 2, using the same reference numerals for the parts of the MOS transistor as those of FIGS. 1(a), (b) and (c), the important insulating parts are denoted as 31a and 31b and are positioned in the same places as the polycrystalline silicon layers 4d and 4e of FIG. 1(b), respectively. Simultaneously with the oxidation of the polycrystalline silicon layers 4d and 4e, parts of the single-crystalline silicon layer 3 are oxidized to the silicon dioxide layers 30a and 30b. This oxidation of the single-crystalline silicon layer is advantageous because the parts of the single-crystalline silicon layer 3, which are contiguous to the polycrystalline silicon layer 3, do not exhibit excellent crystallographic properties. These insulating parts 30a, 30b, 31a and 31b consist of an insulating material of silicon dioxide. In other words, the silicon dioxide layers 30a and 31a are formed between one inclined surface 3c of the silicon layer 3a and both the end 2a of the buried silicon dioxide layer 2 and the end 5a of the silicon dioxide layer 5. In addition, the silicon dioxide layers 30b and 31b are formed between one inclined surface 3d and both the end 2b of the buried silicon dioxide layer 2 and the end 5b of the silicon dioxide layer 5. Although the tapered cross section of the silicon layer 3a has the inclined sides 3c and 3d in a curved form, the silicon layer 3a can have inclined straight sides 3c and 3d as in the case where the tapered cross section of the silicon layer 3a has the trapezoidal cross section shown in FIG. 1(b). The silicon dioxide layers 30a, 30b, 31a and 31b extend through the MOS transistor as shown in the narrowly hatched areas of FIG. 1(c) and, therefore, a short between the source region ($L_s$) and the drain region ($L_d$) does not occur due to the existence of the insulating layers 30a, 30b, 31a and 31b.

Another important part of the MOS transistor in FIG. 2 is the gate insulating layer 7 for protecting the underlying $P^-(N^-)$ silicon layer 3a of the channel region against oxidation and doping. The layer 7 consists of an insulating material, i.e. silicon dioxide, silicon nitride, or alumina, and is used to establish the electrical field in the silicon layer 3. The width $W_G$ of the insulating layer 7 is advantageously smaller than the window width $W_{ox}$ of the insulating layer 2, with the result being that the channel region is created in the $P^-(N^-)$ type silicon layer 3a.

The preferable electrical or physical characteristics of several parts of the MOS transistor according to the present invention are hereinafter explained, mainly with reference to FIG. 1(a).

When the P type silicon substrate 1 is used, the resistivity thereof should be low, i.e. from approximately 0.5 to 2.0 ohm.cm. This is because a low resistivity of P type silicon substrate 1 can advantageously accomplish the channel cut for preventing the generation of a parasitic MOS transistor on the top of the P type silicon substrate 1, and further, because a low resistivity, i.e. a high impurity concentration, of the P type silicon substrate 1 can change the impurity concentration of the epitaxially grown silicon layer 3a to an adequately low $P^-$ concentration. Thus, when the impurity concentration of the P type silicon substrate is too high, the junction capacitance between both the N type silicon layers 3b and 3c and the P type silicon layer 3a is increased, with the result being that the switching speed of the MOS transistor is decreased and the power consumption is increased. Still further, if the impurity concentration of the P type silicon layer 3a becomes too high, the threshold voltage Vth, the body effect and the backgate effect of the MOS transistor are disadvantageously influenced by the too high impurity concentration of the P type silicon substrate.

The buried insulating layer 2 is desirably from 0.5 to 2 microns thick. When the buried insulating layer 2 is thicker than 2 microns, the electrostatic capacitance between the P type silicon substrate 1 and either of the N type doped polycrystalline silicon layers 4a and 4b is smaller than when the layer 2 is less than 2 microns thick. However, when the buried insulating layer 2 is too thick, the altitude difference between the top of this layer 2 and the part of the silicon substrate 1 exposed by the window of this layer 2 is large, and the process for producing the semiconductor device is disadvantageously affected as described later in this specification. The thickness of the insulating layer 2 should, therefore, be from 0.5 to 2.0 microns.

The epitaxially grown silicon layer 3a should have a thickness of from 0.5 to 1.5 microns, and a P type conductivity with a body resistivity $\rho_b$ of from 0.5 to 50 ohm.cm. In order to form a complete junction between the epitaxial silicon layer 3a of the channel region and either of the source and drain regions 4a and 4b, the entire channel region must have P type conductivity. The concentration of the P type impurity in the silicon layer 3a should be so low as to make it withstand the voltage of the junction mentioned above against a reverse bias high enough for the semiconductor device to be operated. When this P type concentration is too high, the switching speed of the MOS transistor is reduced due to the body effect of the silicon layer 3a. The P type concentration of the $P^-$ type silicon layer 3a is such that this layer has a body resistivity $\rho_b$ of from 0.5 to 50 ohm.cm. The term body resistivity $\rho_b$ is used herein to distinguish the resistivity of the body of the semiconductor layers from their surface resistivity $\rho_s$.

Although the preferable characteristics of the MOS transistor having an N channel are explained hereinabove, the same explanation can be applied to an MOS transistor having a P channel.

A process for producing a semiconductor device according to the present invention comprises the steps of:

forming a first insulating layer on a semiconductor substrate having a first conductivity type, the first insulating layer having a window to selectively expose a portion of the semiconductor substrate, the top surface of the first insulating layer being at essentially the same level with or at a higher level than the exposed portion of the semiconductor substrate;

integrally forming a semiconductor layer on both the exposed portion of the semiconductor substrate and the insulating layer, thereby burying the insulating layer below this semiconductor layer;

forming a second insulating layer for selectively masking the semiconductor layer, without covering a first two typically symmetrical regions thereof separated from one another along a first direction, and without covering a second two regions separated from one another along a second direction perpendicular to said first direction the second two regions overlapping at least in part with the window;

changing the non masked, first and second regions of the semiconductor layer to an insulating material;

forming a gate insulating layer on a portion of the semiconductor layer over semiconductor substrate previously exposed by said window in the first insulating layer;

forming a gate electrode on the gate insulating layer; exposing a third two regions of the selectively masked semiconductor layer, these third regions being positioned between the gate electrode and the non masked first regions; and selectively incorporating an impurity of the opposite conductivity type into the third regions of the semiconductor layer by using the gate electrode and the gate insulating layer as a mask, thereby providing one of the third regions with a conductivity suited for a source region of the semiconductor device, and the other of these third regions with a conductivity suited for a drain region of the semiconductor device.

An embodiment of the process according to the present invention comprises the steps of:

forming a first insulating layer on a semiconductor substrate having a first conductivity type, the insulating layer having an almost quadrilateral window to expose a portion of the semiconductor substrate;

integrally forming a semiconductor layer on both the exposed portion of the semiconductor substrate and the first insulating layer, a portion of this semiconductor layer growing epitaxially as a single crystal on the exposed portion of the semiconductor substrate, and the other portion of the semiconductor layer being deposited as a first polycrystalline semiconductor layer;

forming a second insulating layer for selectively masking the single-crystalline semiconductor layer, without covering a first two regions thereof which overlap at least in part with the window at a first two opposite sides of the window, and for selectively covering the first polycrystalline semiconductor layer, leaving exposed a first two regions thereof spaced from the second two opposite sides of the window;

changing the non masked, first regions of the single-crystalline semiconductor layer and the selectively exposed first two regions of the polycrystalline semiconductor layer to an insulating material;

forming a second polycrystalline semiconductor layer on the insulating layer and the semiconductor layers changed to the insulating material and patterning the second polycrystalline semiconductor layer to be used as a mask by the following removing step;

removing the insulating layer along the second opposite sides of the quadrilateral window, thereby exposing a second two regions of the first polycrystalline semiconductor layer and a second two regions of the single-crystalline semiconductor layer, except for the middle part thereof, thus providing the remaining insulating layer with a predetermined gate width; and incorporating an impurity into the second two regions of the single-crystalline semiconductor layer and the second two regions on the first polycrystalline semiconductor layer.

Another process for producing a semiconductor device according to the present invention comprises the steps of:

forming a first insulating layer on a semiconductor substrate of a first conductivity type, the insulating layer having a window to selectively expose a portion of the semiconductor substrate, and the top surface of the first insulating layer being at essentially the same level with or at higher level than the exposed portion of the semiconductor substrate;

integrally forming a semiconductor layer on both the exposed part of the semiconductor substrate and the first insulating layer, thereby burying the first insulating layer below the semiconductor layer;

forming a second insulating layer for selectively masking the semiconductor layer, without covering a first two generally symmetric regions of the semiconductor layer that are separated from one another in a first direction, and without covering a second two regions which are separated from one another in a second direction perpendicular to said first directions and, the second two regions overlapping the window at least in part;

removing said semiconductor layer using said second insulating layer as the mask;

forming a thin insulating layer having a thickness suited for establishing a channel region thereunder, thereby covering the semiconductor layer by the thin insulating layer;

forming a gate electrode on said thin insulating layer; and selectively incorporating an impurity of the opposite conductivity type into an exposed third two regions of the semiconductor layer by using the gate electrode and the thin insulating layer for the mask, thereby providing one of the third regions with a conductivity suitable for a source region of the semiconductor device, and the other of these third regions with a conductivity suitable for a drain region of the semiconductor device.

According to the process by means of a selective oxidation technique, a buried insulating layer is formed, by masking one higher portion of the semiconductor substrate and by selectively oxidizing the non masked lower portion thereof, and the window is formed by removing the mask from said one portion, thereby providing the top surface of the buried insulating layer with essentially the same level with that of the semiconductor substrate.

Examples of the production of the N channel MOS transistor is explained in detail below with reference to FIGS. 3 through 15.

BRIEF DESCRIPTION OF THE DRAWINGS

FIGS. 3(a), 4, 5(a), 6(a), 7(a), 8, 10–14(a) and 16 are cross sectional views similar to FIG. 1(a) of various embodiments according to the present invention;

FIGS. 4, 5(b), 6(b), 7(b), 10(b)–14(b), and 15 are cross sectional views similar to FIG. 1(b) of various embodiments according to the present invention, and;

DESCRIPTION OF THE PREFERRED EMBODIMENTS

Figure 3:
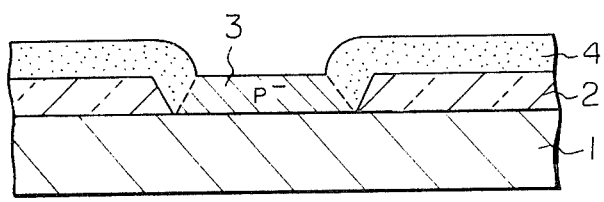
Figure 4:
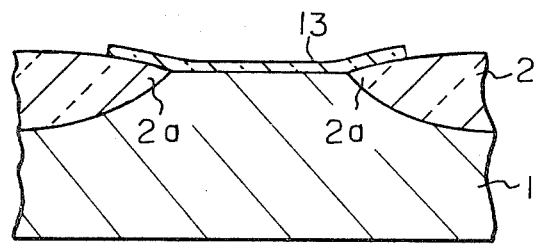

The insulating layer of silicon dioxide 2 (FIG. 3) having a thickness of from 0.5 to 2.0 microns is formed on the P type silicon substrate 1 by the thermal oxidation of the silicon substrate 1 and is, then, provided with a quadrilateral window to expose a part of the P type silicon substrate 1, as to an example of the process according to the present invention. It is possible to perform a selective oxidation of the silicon substrate 1 (FIG. 5) by a method referred to as LOCOS or ISOPLANAR using a silicon nitride mask 13 (FIG. 4). In the case of this selective oxidation, the difference in height between the top of the silicon dioxide layer 2 (FIG. 4) and the exposed part of the silicon substrate is smaller than the difference brought about by the above thermal oxidation of the silicon substrate.

When the thickness of the silicon dioxide layer 2 exceeds 2 microns, it is difficult to precisely align the masks for patterning the layers formed on the thermally oxidized silicon dioxide layer 2. In addition, the aluminum wires 9, 10 and 11 are likely to disconnect. In the case of the selectively oxidized silicon dioxide layer 2 (FIG. 4), when the thickness of the silicon dioxide layer 2 exceeds 2 microns, the so called bird beak, i.e. the end 2a of the silicon dioxide layer 2, is so enlarged that it is impossible to produce semiconductor elements having fine patterns.

The silicon layer 4 (FIG. 3) is deposited from a vapor phase on the top of the silicon dioxide layer 2 and the exposed part of the P type silicon substrate 1. A preferable condition for the silicon vapor growth is as follows.

A source of silicon: non doped monosilane (SiH$_4$) gas (1% SiH$_4$ in H$_2$)
a carrier gas: H$_2$
Molar ratio of SiH$_4$ to H$_2$: 0.2–0.3
Temperature of silicon substrate: 1000°–1050° C.
Pressure in the growth vessel: 1 atmosphere or lower
Growth rate: 1.0 micron per minute The epitaxially grown silicon layer 3 has a P type impurity concentration of $6 \times 10^{14}$ to $5 \times 10^{15}$ cm$^{-3}$, because the P type silicon substrate has a relatively high impurity concentration, as stated before, and further, non doped monosilane gas is used for the growth source. At the present level of technology, it is possible to easily reproduce the impurity concentration of from $6 \times 10^{14}$ to $5 \times 10^{15}$ cm$^{-3}$, because the monosilane gas is non doped. The thickness of the epitaxial silicon layer 3 should be from 0.5 to 1.5 microns. As stated before with reference to FIG. 1(a), a part of the silicon layer 4, deposited on or in the proximity of the silicon dioxide layer 2, becomes polycrystalline.

Figure 5A:
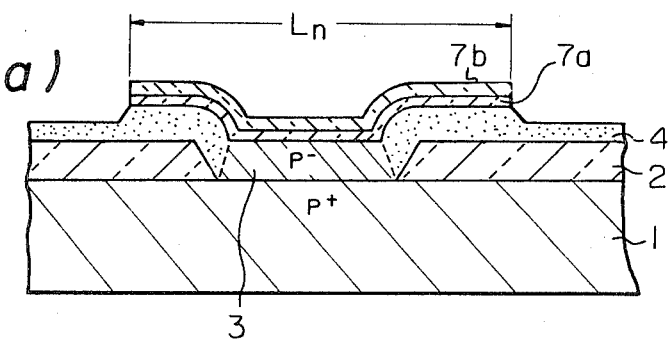

The silicon dioxide layer 7a (FIGS. 5(a) and (b)) having a thickness of approximately 500 Å is formed on the silicon layers 3 and 4 by thermal oxidation of the layers 3 and 4, and the silicon nitride layer 7b having a thickness of from approximately 1000 to 1500 Å is deposited on the silicon dioxide layer 7a. The silicon nitride layer 7b may be directly deposited on the silicon layers 3 and 4. The silicon nitride layer 7b (FIGS. 5(a) and (b)) is removed by using a photoresist mask (not shown) and a plasma etching, except for the part having a width $W_n$.

Figure 5B:
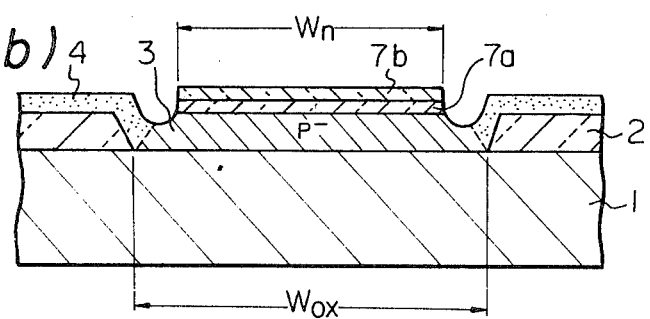

The width $W_n$ of the remaining silicon nitride layer 7b (FIG. 5(b)) should be such that the width $W_G$ of the channel region mentioned before, is smaller than the window width $W_{ox}$ of the silicon dioxide layer 2. This does not necessarily mean that the width $W_n$ should be smaller than $W_{ox}$, for the reasons explained hereinafter. The length $L_n$ of the remaining silicon nitride layer 7b (FIG. 5(a)) is such that a part of the polycrystalline silicon layer 4 is left unexposed below the silicon nitride layer 7b.

The remaining silicon nitride layer 7b (FIGS. 5(a) and (b)) is used as a mask and the exposed silicon dioxide layer 7a, having a thickness of 500 microns, is removed. The now exposed silicon layers 3 and 4 are removed to reduce their thickness to approximately 55% of the previous thickness. Namely, when the silicon layers 3 and 4 are grown to a thickness of 1 micron, these layers are then reduced to a thickness of 5500 Å.

The removal of the silicon dioxide layer 7a and the silicon layers 3 and 4 is conducted by plasma etching or with a solution of nitric acid and hydrofluoric acid. A part of the single-crystalline silicon layer 3 and a part of the polycrystalline silicon layer 4 are exposed, as shown in FIGS. 5(a) and (b), as a result of the selective removal of the silicon nitride layer 7b and the silicon dioxide layer 7a. These exposed silicon layers 3 and 4 are subjected to thermal oxidation, so as to change these layers 3 and 4 to the silicon dioxide layers 5, 30a, 30b, 31a and 31b (FIGS. 6(a) and (b)), respectively. It should be noted that the silicon dioxide layers 30a and 30b (FIG. 6(b)) are formed even below the silicon nitride layer 7b.

This is because of the fact that in the step of removing the silicon dioxide layer 7a and removing the silicon layers 3 and 4 (FIG. 5(a) and (b)), side etching occurs between the silicon nitride layer 7b and the silicon dioxide layer 7a. The silicon dioxide layers 30a and 30b being formed during the thermal oxidation of the exposed silicon layers 3 and 4, therefore, necessarily penetrate below the side-etched silicon nitride layer 7b. This penetration of silicon dioxide is referred to as the bird beak. Consequently, even when the width $W_n$ of the silicon nitride layer is larger than the window width $W_{ox}$, the requirement of $W_G$ (the width of the channel region) $< W_{ox}$ is satisfied. The silicon of the layers 4d and 4e FIG. 1(b) is oxidized from the top to the bottom of these layers. When this requirement is satisfied and the silicon dioxide layers 30a, 30b and 31a and 31b are thus present along the two sides 3c and 3d of the single-crystalline silicon layer 3a, respectively, it is possible to prevent a short between the source and drain regions 4a and 4b, respectively (FIG. 6(a)).

When the oxidation of the exposed silicon layers 3 and 4 (FIGS. 5(a) and (b)) is performed under the condition $W_G \geq W_{ox}$, the masked polycrystalline silicon layer 3 is left unoxidized, and is doped with an impurity for forming the source and drain regions, as explained with reference to FIGS. 1(b) and (c). Consequently, the source region and the drain region are shorted or, even if the short does not take place, the withstanding voltage between the source and drain regions is reduced or the leakage current between these regions is disadvantageously increased. Furthermore, generally speaking, when a silicon dioxide layer is formed on the polycrystalline silicon layer and on the single-crystal silicon layer, the withstanding voltage of the silicon dioxide layer on the polycrystalline silicon layer is less than that on the single-crystalline silicon layer. The silicon dioxide layer 7 (FIG. 1(b)) on the polycrystalline silicon layers 4d, 4e is therefore disadvantageous, in view of the low withstanding voltage of the gate. On the otherhand, when the width $W_G$ of the channel region is smaller than the window width $W_{ox}$, the exposed polycrystalline silicon layers 4d, 4e are advantageously oxidized to the thick silicon dioxide layers 30a, 30b. After this oxidation, the insulating layers 7a and 7b are removed, because the properties of these insulating layers 7a and 7b are deteriorated during the oxidation to such an extent as to make them unsuitable for the gate insulating material. The exposed single-crystalline silicon layer 3a and the exposed polycrystalline layers 4a and 4b are again oxidized to form the silicon dioxide layer 7 (FIGS. 7(a) and (b)) having a thickness of from 500 to 1000 angstroms, and the polycrystalline silicon layer 6 is deposited on the silicon dioxide layer 7 to a thickness of from 3000 to 5000 angstroms.

Figure 7A:
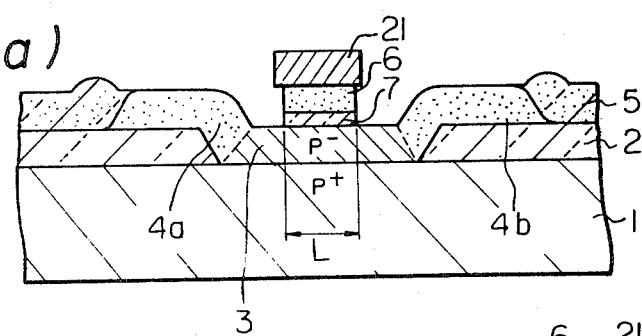
Figure 7B:
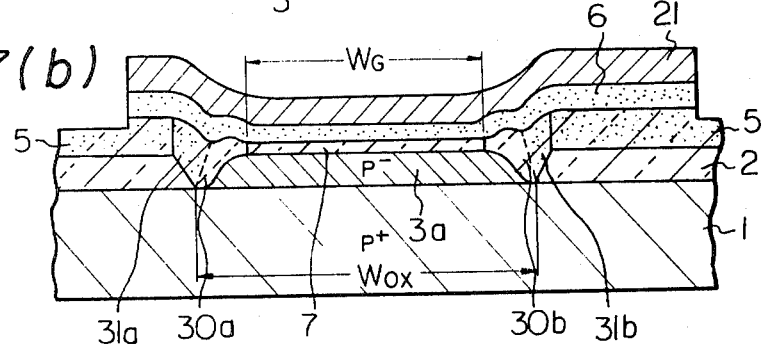

The polycrystalline silicon layer 6 (FIGS. 7(a) and (b)) is deposited on the entire top of the silicon dioxide layers 30a, 30b, 5 and 7 and, then, patterned by a photoresist 21 to form the gate electrode 6. The width of the gate electrode 6 (FIG. 7(b)) is considerably larger than the width $W_G$. In order to make the length of the silicon dioxide layer 7 (FIG. 7(a)) equal to the length of the gate electrode 6, the exposed part of the thin silicon dioxide layer 7 is entirely removed by self alignment of the polycrystalline silicon layer 6 by using an etching solution of fluoric acid. Instead of silicon for the layer 6, molybdenum and tungsten can be used.

Figure 8:
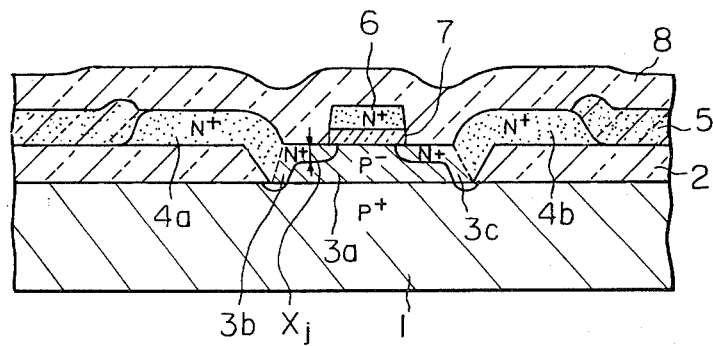

Subsequently, the PSG layer 8 (FIG. 8) is deposited to a thickness of 8000 Å on the entire top surface of the semiconductor structure as shown in FIG. 8, and the phosphorous contained in the PSG layer 8 at a content of 20% is then doped by the following annealing into the polycrystalline silicon layers 4a, 6 and 4b, as well as the single-crystalline silicon layers 3b and 3c (FIG. 8), to change the conductivity type of these layers. The selective doping into the semiconductor layers 3, 4a and 4b is achieved by the self alignment of the masking, polycrystalline silicon layer 6 and silicon dioxide layer 7. The annealing can be performed in an oxygen atmosphere, at a temperature of 1050° C., for 20 minutes, and the phosphorous is doped into the layers 3b, 3c 4a, 4b and 6. Since the diffusion constant of phosphrous in polycrystalline silicon is two or three times larger than that in single-crystalline silicon, the phosphorous of the PSG layer 8 penetrates into the single-crystalline silicon layers 3b and 3c not only from the exposed top of the layers 3b and 3c, but also from the polycrystalline silicon layers 4a and 4b. The N+-P− junction is, therefore, formed between the N+ doped silicon layers 3b and 3c and the P− type silicon layer 3a. The depth of the penetration mentioned above is approximately 0.5 microns. The junction depth Xj (FIG. 8) amounts to from 0.5 to 0.6 microns. The surface resistivity $\rho_s$ of the N+ layer having a depth Xj amounts to from 17 to 18 ohm.

It is preferable to incorporate boron ions, prior to the deposition of the polycrystalline silicon layer 6, by an ion implantation method into the single-crystalline silicon layer 3a through the thin silicon dioxide layer 7 (FIG. 8(a)) to a concentration of from $1 \times 10^{11}$ to $1 \times 10^{12}$ cm$^{-2}$, especially $3 \times 10^{11}$ cm$^{-2}$, thereby controlling the Vth of the gate to approximately 1.0 volt. Windows are next formed in the PSG layer 8 so as to locate the end of the aluminum wires 9, 10 and 11 (FIGS. 1(a), 1(c) and 2) in these windows.

Figure 9:
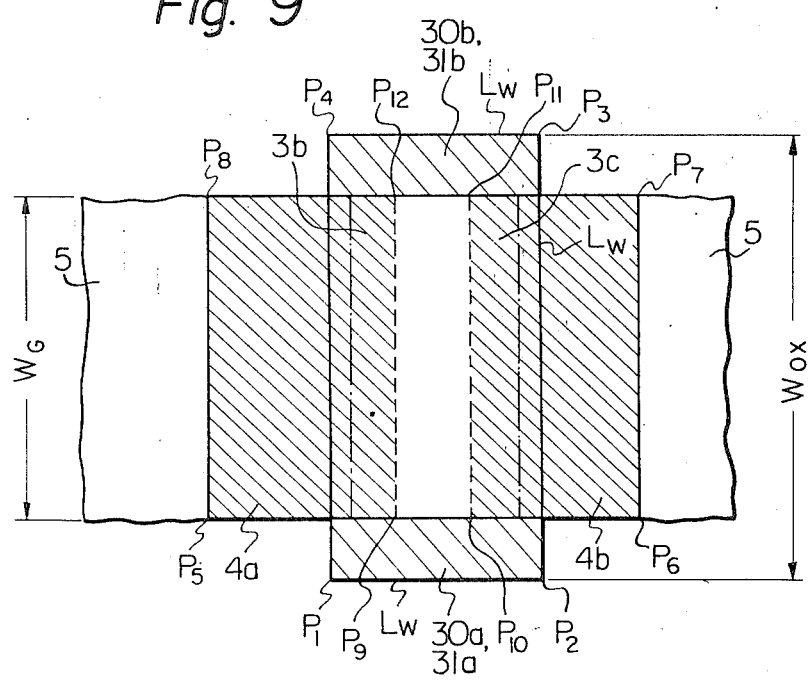
FIG. 9 is a schematic plan view of the MOS transistor.

The planar relationship between several of the layers, shown in FIGS. 5 through 8 will be apparent from FIG. 9.

Figure 6A:
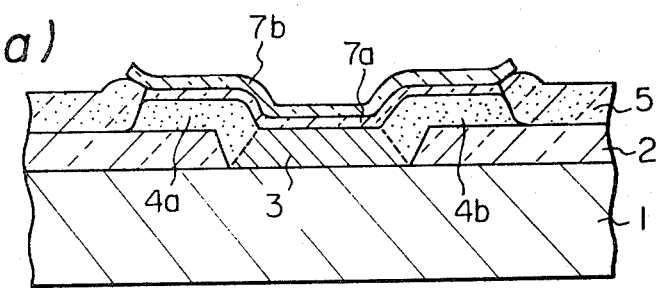
Figure 6B:
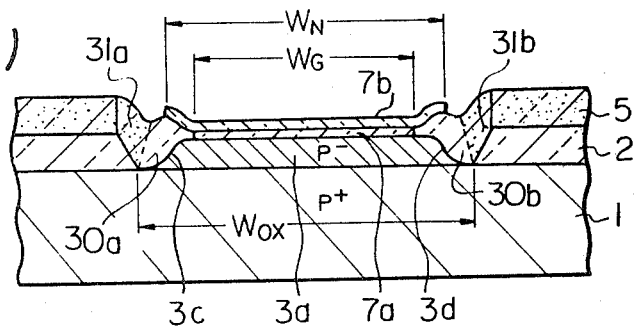

The area sourrounded by the points P$_5$ through P$_8$ indicates the peripheral end of the silicon dioxide layer 7a (FIGS. 6(a) and (b)), i.e. the insulating layer. The line L$_w$ indicates the quadrilateral four sides of the window of the silicon dioxide layer 2. The lines P$_1$-P$_2$ and P$_3$-P$_4$ correspond to first opposite sides of the quadrilateral window L$_w$. The areas 5, which are firstly exposed, correspond to the first two regions of the semiconductor layer and to selectively exposed regions of the first polycrystalline silicon layer 4. At least polycrystalline areas 31a and 31b, preferably together with the single-crystalline areas 30a, 30b, are also left exposed by the silicon dioxide layer 7a (FIGS. 6(a) and (b)) and thus, correspond to the second two regions of the semiconductor layer and to the non masked first region of the single-crystalline semiconductor layers 30a, 30b, 31a and 31b. The areas 30a, 30b, 31a, 31b, and 5 are changed to an insulating material usually by oxidation. The areas numbered 4a and 4b (FIG. 6(a)) correspond to the first non exposed parts of the polycrystalline silicon layer and are not oxidized. The lines P$_4$-P$_1$ and P$_3$-P$_2$ correspond to the second opposite sides of the quadrilateral window L$_w$. The areas 3b and 3c, separated from the areas 4a and 4b by the chain lines correspond to the second regions of the single-crystalline silicon layer 3. After the oxidation, the hatched area of the silicon dioxide layer 7a is removed. The gate insulating layer 7 is formed by removing the silicon dioxide layer on the area P$_5$-P$_6$-P$_7$-P$_8$, except for the area P$_9$-P$_{10}$-P$_{11}$-P$_{12}$. As a result, the previously non exposed first regions 4a and 4b of the polycrystalline silicon layer 4 and the second regions 3b and 3c of the single-crystalline silicon layer 3 are exposed. Into these layers 3b, 3c, 4a and 4d, an impurity is incorporated by using the silicon dioxide layer 7 and the gate electrode 6 (not hatched in FIG. 9 and surrounded by the lines P$_9$-P$_{10}$-P$_{11}$-P$_{12}$) as the mask.

Another example of the process for producing the semiconductor device by means of the selective oxidation of the semiconductor substrate is explained in connection with FIGS. 10(a), (b) through 13(a), (b), wherein the figures with (a) and (b) indicate the same cross sectional view as FIGS. 1(a) and (b), respectively. In these figures the same parts of the semiconductor device as are illustrated in FIGS. 3 through 9 are denoted by the same number.

Figure 10A:
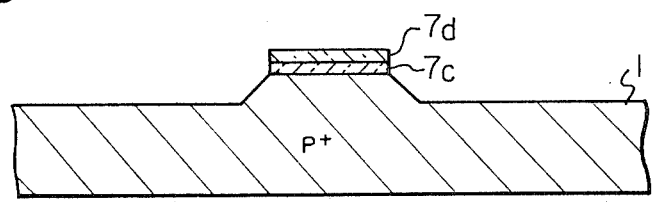
Figure 10B:
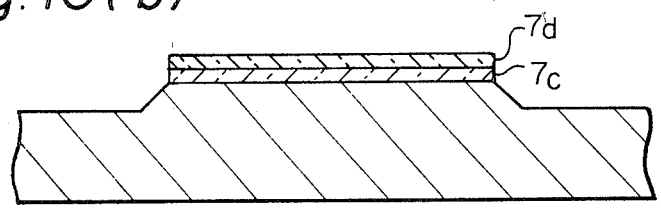

The flat surface of the P+ type silicon semiconductor substrate 1 (FIGS. 10(a) and 10(b)) is oxidized to a thickness of from 500 to 600 angstroms, thereby forming the silicon dioxide layer 7c. The silicon nitride layer 7d is then deposited on the silicon dioxide layer 7c to a thickness of from 1000 to 1500 angstroms. These layers 7c and 7d are selectively left on a portion of the semiconductor silicon substrate 1, so as to expose the other portion of the substrate for forming the buried insulating layer. The exposed part of the semiconductor substrate 1 is etched by using the layers 7c and 7d for the mask against the etching, to a depth of approximately 55% of the buried insulating layer's thickness. The etching depth is for example 5500 angstroms.

Figure 11A:
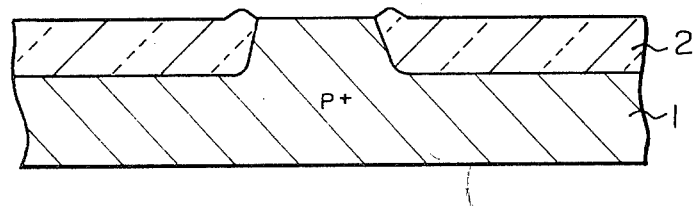
Figure 11B:
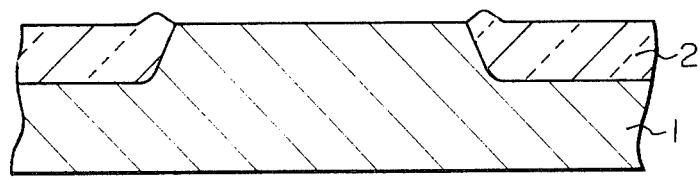

The buried silicon dioxide layer 2 (FIGS. 11(a) and (b)) is formed by the selective oxidation technique. Namely, the exposed part of the semiconductor substrate 1 is oxidized by using the layers 7c and 7d for the mask to a thickness of for example 1 micron. The oxidation is carried out under the conditions of, for example, a temperature of 1100° C. for 90 minutes with steam oxidation. As a result of the oxidation, the surface of the silicon dioxide layer 2 becomes essentially the same level as the level of the protruded part of the semiconductor substrate 1. Subsequently, the silicon nitride layer 7d is removed by a heated phosphoric acid and the silicon dioxide layer 7c is removed by a solution of fluoric acid.

After completely washing the top exposed surface of the silicon semiconductor substrate 1, the silicon layer is deposited on the exposed semiconductor substrate 1 and the buried insulating layer 2, with the result being that the silicon deposited on the semiconductor substrate 1 becomes the single-crystalline layer 3, and further, the silicon deposited on the buried insulating layer and in its proximity becomes polycrystalline layer 4. The silicon dioxide layer 7e and the silicon nitride 7f are formed, and then, the exposed part of the silicon layers 3 and 4 are partly removed, as previously described in connection with FIGS. 5(a) and (b). The depth of the removal is, for example, 5500 angstroms. The boron ions for the formation of the channel cut are ion-implanted on the exposed surface of the silicon layers 3 and 4, thereby forming an ion-implanted surface on these layers. The penetration of the ions is indicated by the dotted lines in FIGS. 12(a) and (b). The density of the ion implantation is preferably from $1 \times 10^{12}$ to $1 \times 10^{13}$ atoms/cm$^2$, and the energy of the ion implantation is from 30 to 100 KeV.

Figure 12A:
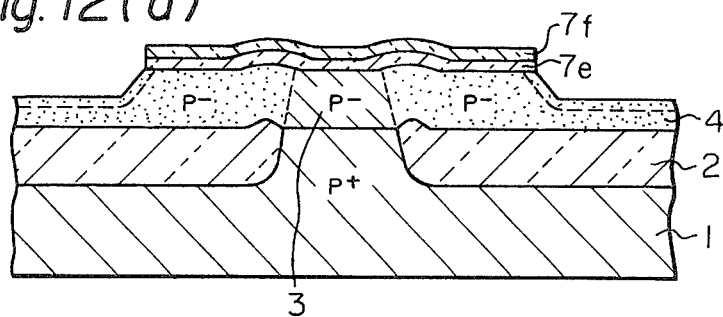
Figure 12B:
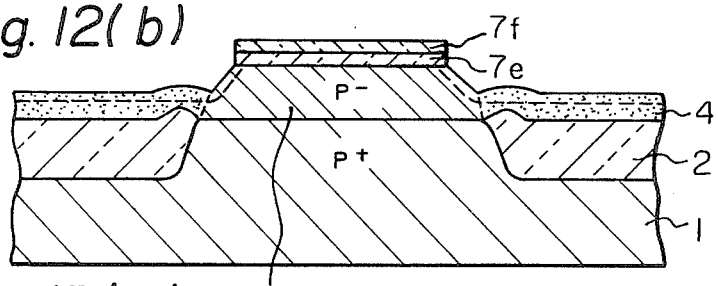

The exposed polycrystalline silicon layer 4 and the exposed single-crystalline silicon layer 3 are oxidized by the same procedure as described with reference to FIGS. 6(a) and (b). It is to be noted that the non masked part of the single-crystalline silicon layer 3 by the insulating layers 7e and 7f is oxidized to silicon dioxide. The oxidation is performed, so that the 1 micron-thick silicon dioxide layers 30a and 30b are formed. After this oxidation, the insulating layers 7e and 7f are removed, because the properties of these insulating layers 7e and 7f are deteriorated during the oxidation to such an extent as to make them unsuitable for the gate insulating material. The exposed single-crystalline silicon layer 3 and the exposed polycrystalline layers 4a, 4b, 4g and 4f are again oxidized to form the silicon dioxide layer 7e (FIGS. 12(a) and (b)) having a thickness of from 500 to 1000 angstroms, and the polycrystalline silicon layer 6 is deposited on the silicon dioxide layer 7e to a thickness of from 3000 to 5000 angstroms. By the same procedure as described with reference to FIGS. 7(a) and (b), the gate region pattern is produced by the self alignment technique from these layers 6 and 7 (FIGS. 12(a) and (b)). As is clear from FIG. 13(b), the requirement of $W_G < W_{ox}$ is thus satisfied. When the semiconductor structure as shown in FIGS. 12(a) and (b) is produced, the ion-impanted boron diffuses into the interior of the polycrystalline and single-crystalline silicon layers 4 and 3, respectively. The outer parts of the P− type polycrystalline silicon layer 4a, 4b, as well as outer parts of the P− type single crystalline silicon layer 3a, are advantageously changed to the P+ type channel stops 4f, 4g and 3b, 3c, respectively. The boron diffuses also into the regions 1b and 1c of the semiconductor substrate 1.

Figure 14A:
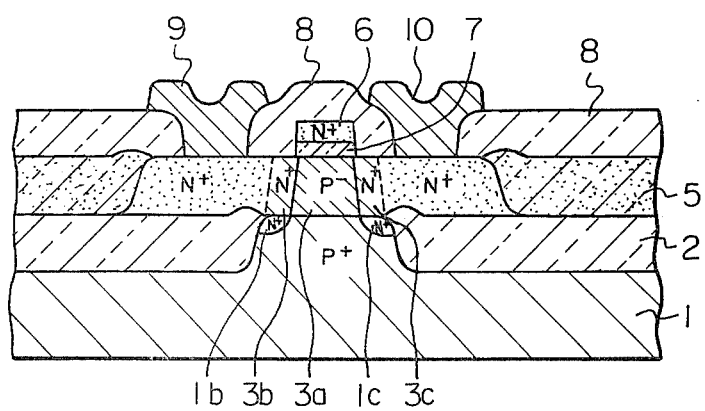
Figure 14B:
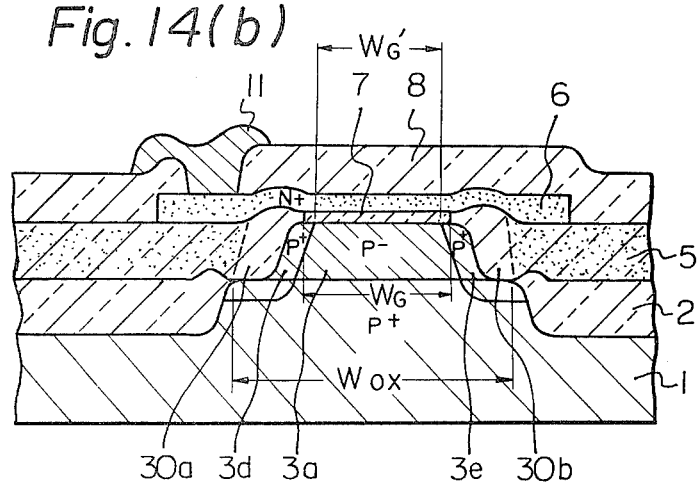

Subsequently, the PSG layer 8 is depostied on the entire top of the semiconductor structure as illustrated in FIGS. 14(a) and (b), and the phosphorous is doped by using the gate electrode 6 and the gate insulating layer 7 as a mask, so as to change the conductivity type of the polycrystalline silicon layers 4a, 4b and the single-crystalline silicon layers 1b, 1c, 3b and 3c from the P type to the N type. The aluminum electrodes 9, 10 and 11 are produced by the same procedure as explained in connection with FIGS. 1(a) and (b).

As will be understood from the semiconductor device as illustrated in FIGS. 14(a) and (b), the silicon semiconductor layers 4a, 3b, 3a, 3c and 4b are almost flat and do not include curved portions as illustrated in FIG. 8, and therefore, the danger of disconnection of these layers and all of the layers formed thereon is reduced.

Figure 13A:
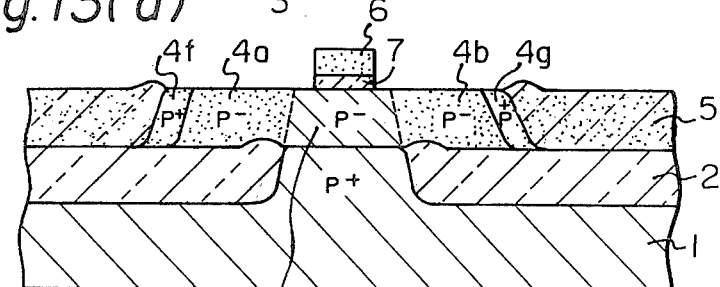
Figure 13B:
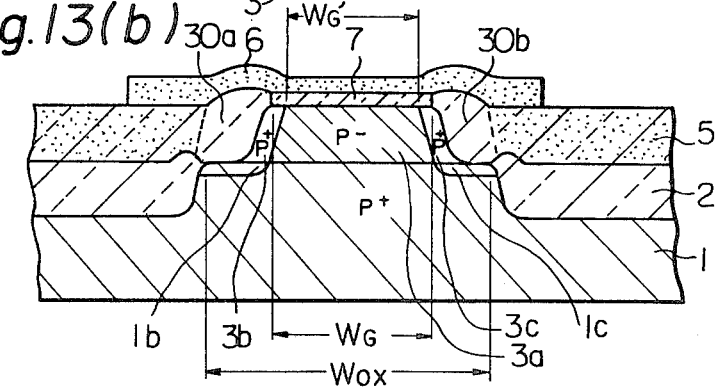
Figure 15:
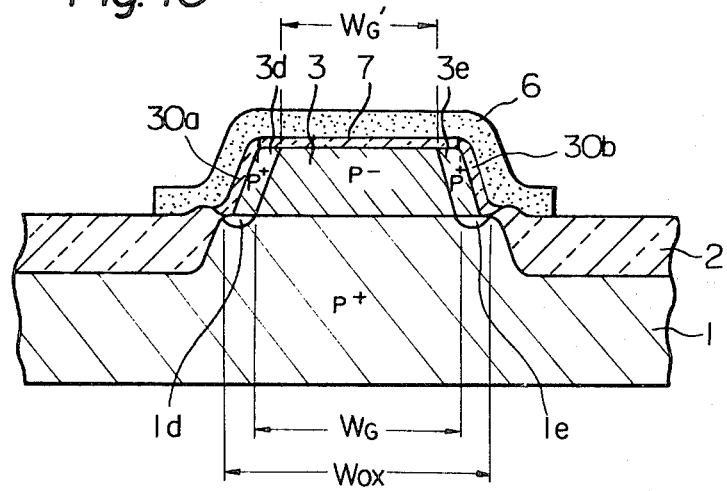
Figure 16:
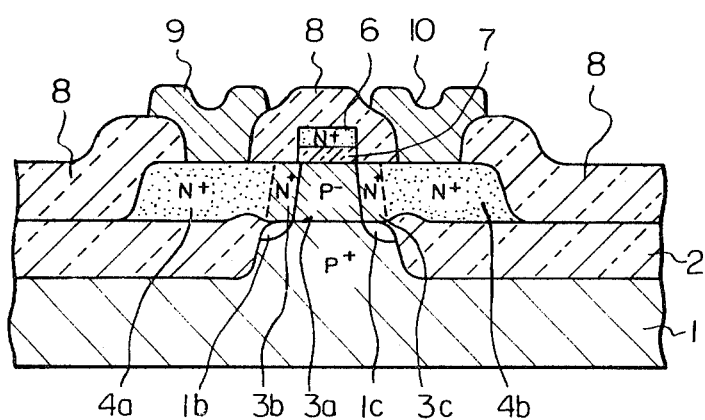

Still another example of the process for producing the semiconductor device is explained in connection with FIGS. 15 and 16, which correspond to FIG. 13(b) and FIG. 14(a), respectively. In this example, instead of forming the thick silicon dioxide layer 5 (FIGS. 14(a) and (b)), only the thin silicon dioxide layers 30a and 30b (FIG. 15) are formed on the two sides of the single-crystalline silicon dioxide layer 3. This silicon semiconductor layer can be produced simultaneously with the silicon dioxide layer 7 for the gate region. It is to be noted that the requirement of $W_G < W_{ox}$ is also satisfied in this example. The PSG layer 8 (FIG. 16) is applied on the buried insulating layer 2. As seen in FIG. 15, no semiconductor layer is present along the two sides of the single-crystalline semiconductor layer 3 and a MESA type structure is formed in this Example.

In the examples, where the channel stop regions 3b, 3c, 3d and 3e (FIGS. 13b and 15) are formed, the effective width of the channel region is reduced from the width $W_G$ of the gate insulating layer 7 due to the channel stop regions and amounts only to the value $W_G'$.

An example of the N-channel, single gate MOS type transistor is explained hereinafter with regard to the production conditions and the electrical characteristics.

The production conditions were as follows.

1. Silicon substrate 1:
   P+ conductivity, and; $\rho_b$ of 1 ohm·cm.
2. Silicon dioxide layer 2:
   thermal oxidation at 1100° C. for 150 minutes; window width $W_{ox}$ of 15 microns; and thickness of 1 micron.
3. P− type silicon layer 4:
   thermal decomposition of $SiH_4$ at 1050° C., thickness 1 micron, and $\rho_b$ of 20 ohm·cm.
4. Gate insulating layer 7a:
   thermal oxidation at 1050° C. for 42 minutes; gate width $W_G$ of 10 microns (invention) and 17 microns (control), and; gate length of 4 microns.
5. Oxidation of the exposed silicon layers 3 and 4:
   1100° C. for 150 minutes.
6. Polycrystalline silicon layer 6:
   thermal decomposition of $SiH_4$ at 900° C. for 1 minute, and thickness of 0.5 micron.
7. PSG layer 8:
   phosphorous content 20%, and annealing at 1000° C. for 5 minutes.
8. Aluminum wires 9, 10 and 11:
   vapor deposition of Al at 2400° C. for 3 minutes.

The electrical properties of the produced MOS type transistor are shown in the following Table.

|  | Invention ($W_{ox} > W_G$) | Control ($W_{ox} \leq W_G$) |
| --- | --- | --- |
| Withstand Voltage between the Source and Drain Regions | more than 25 volts at a drain current $I_D$ of 1 μA | less than 5 volts at a drain current $I_D$ of 1 μA |
| Leakage Current | less than $10^{-10}$A at the voltage $V_{SD}$ applied between the source and drain regions of 20 volts | approximately $10^{-6}$A at $V_{SD}$ of 5 volts |
| Junction Depth Xj | 0.5 μm | 0.5 μm |

Figure 17:
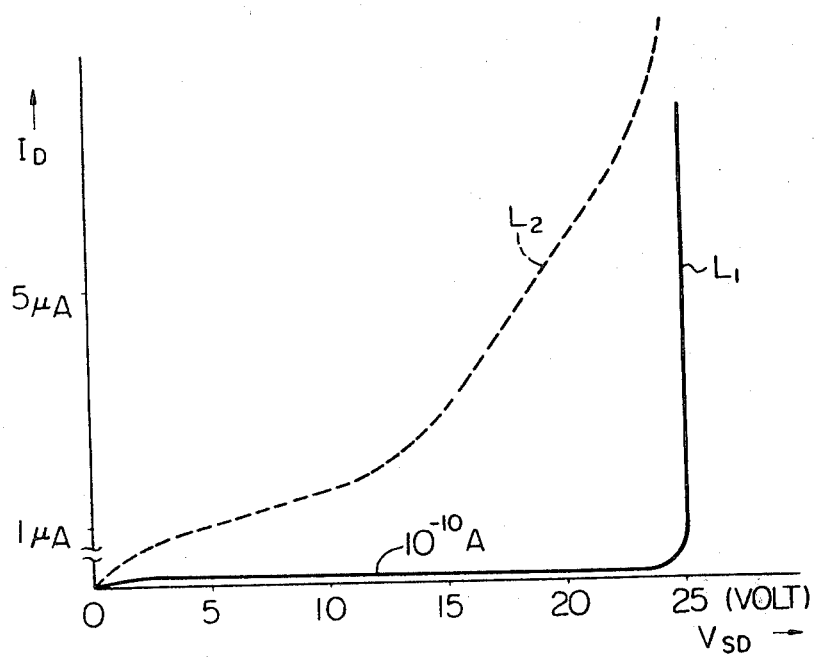
FIG. 17 shows the dependence of the drain current $I_D$ upon the voltage $V_{SD}$ between the source and the drain regions.

The dependence of the drain current $I_D$ upon the voltage $V_{SD}$ between the source and drain regions is shown in FIG. 17, wherein the solid line $L_1$ represents the MOS transistor according to the present invention and the dotted line $L_2$ represents the known MOS transistor. The drain current $I_D$ is negligibly small according to the present invention until the MOS transistor breaks down, while the drain current of the known MOS transistor considerably increases with the increase of the voltage $V_{SD}$. When the withstand voltage is evaluated in terms of the voltage, at which 1 μA of the drain current $I_D$ is passed, the withstand voltage of the known MOS transistor amounts to only 5 volts, while the withstand voltage of the MOS transistor according to the present invention amounts to 25 volts.

What we claim is:

1. A semiconductor device comprising:
   a semiconductor substrate having a first conductivity type;
   a first insulating layer on said semiconductor substrate, said first insulating layer having a window on a first part of said substrate;

an integral semiconductor layer selectively covering said first part of said substrate and said first insulating layer, a first portion of said semiconductor layer being in contact with said substrate and having a first width along a first direction, at least a second portion of said semiconductor layer within said first portion being single crystalline;

a thin insulating layer selectively covering said second portion of said semiconductor layer above said first part of said substrate, said thin insulating layer having a thin thickness suited for establishing a channel region thereunder in said second portion of said semiconductor layer and having a first width in said first direction that is smaller than said first width of said semiconductor layer;

a gate electrode on said thin insulating layer; and an insulating component located at each of two respective ends of said semiconductor layer, said two ends comprising the two sides of said semiconductor layer that are crossed by a line parallel to said first direction, said two insulating components extending perpendicularly to said first direction along the two respective sides of said channel region and being essentially thicker than said thin insulating layer.

2. A semiconductor device comprising:

a semiconductor substrate having a first conductivity type;

a first insulating layer on said semiconductor substrate, said first insulating layer having a window on a first part of said substrate;

an integral semiconductor layer selectively covering said first part of said substrate and said first insulating layer, a first portion of said semiconductor layer being in contact with said substrate and having a first width along a first direction, at least a second portion of said semiconductor layer within said first portion being single crystalline;

a thin insulating layer selectively covering said second portion of said semiconductor layer above said first part of said substrate, said thin insulating layer having a thin thickness suited for establishing a channel region thereunder in said second portion of said semiconductor layer and having a first width in said first direction that is smaller than said first width of said semiconductor layer;

a gate electrode on said thin insulating layer;

an insulating component located at each of the two respective ends of said semiconductor layer, said two ends comprising the two sides of said semiconductor layer that are crossed by a line parallel to said first direction, said two insulating components extending perpendicularly to said first direction along two respective sides of said channel region and having essentially the same thickness as said thin insulating layer; and a channel doped region having said first conductivity under each of said two insulating components in said semiconductor layer.

3. A semiconductor device according to claim 1 or 2, said substrate having resistivity in the range from 0.5 to 2 ohm cm.

4. A semiconductor device according to claim 1 or 1 said first insulating layer having a thickness in the range from 0.5 to 2 microns.

5. A semiconductor device according to claim 1 or 1, said semiconductor layer having a thickness of from 0.5 to 1.5 microns and said single-crystal second portion of said semiconductor layer having a body resistivity of from 0.5 to 60 ohm cm.

6. A process for producing a semiconductor device comprising the steps of:

forming a first insulating layer on a semiconductor substrate of a first conductivity type, said insulating layer having a window to selectively expose a first part of said substrate, the top surface of said insulating layer being not at an essentially lower level than, the surface of said first part of said substrate;

selectively forming a semiconductor layer on said first part of said substrate and on said first insulating layer, said semiconductor layer over said first part of said substrate comprising a single crystal part;

forming a second insulating layer selectively on said semiconductor layer to expose a first two portions of said semiconductor layer, said first two portions being separated from one another along a first direction, and a second two portions which are separated from one another in a direction perpendicular to said first direction and which selectively overlap said window at the sides of said window oriented parallel to said first direction;

changing said first and second two portions of said semiconductor layer to an insulating material;

selectively forming a gate insulating layer on said semiconductor layer over said first part of said substrate, said gate insulating film being thinner than the thickness of said insulating material;

forming a gate electrode on said gate insulating layer;

exposing a third two portions of said semiconductor layer between said gate electrode and said first two portions; and selectively incorporating an impurity of conductivity type opposite to said first conductivity type into said third two regions of said semiconductor layer by using said gate electrode and gate insulating layer as a mask to provide said third two regions with a conductivity suitable for source and drain regions.

7. A process according to claim 6 comprising forming the surface of said substrate to have higher and lower portions, masking said higher portion of said surface of said substrate and selectively oxidizing said lower portion, and forming said window by removing said mask from said higher portion, thereby providing the top surface of said first insulating layer with essentially the same level as that of said oxidized lower portion of said substrate.

8. A process for producing a semiconductor device according to claim 6 or 7, wherein said substrate has a resistivity of from 0.5 to 2 ohm cm.

9. A process for producing the semiconductor device according to claims 6 and 7, wherein said first insulating layer has a thickness of from 0.5 to 2 microns.

10. A process for producing a semiconductor device according to claims 6 and 7, comprising forming said semiconductor layer to have a thickness of from 0.5 to 1.5 microns, and forming said single-crystal part to have a body resistivity of from 0.5 to 50 ohm cm.

11. A process for producing the semiconductor device according to claims 6 and 7, said semiconductor layer covering said first insulating layer being polycrystalline with a resistivity of from 18 to 20 ohm cm.

12. A process for producing a semiconductor device comprising the steps of:

forming a first insulating layer on a substrate having a first conductivity type, said insulating layer having a window to selectively expose a first portion of said substrate, the top surface of said insulating layer being not at an essentially lower level than said first portion of said substrate;

integrally forming a semiconductor layer on said first portion of said substrate and said first insulating layer, said semiconductor layer comprising a single-crystal part on said first portion and a polycrystalline part on said first insulating layer;

forming a second insulating layer for selectively masking said semiconductor layer, said masking exposing a first two regions of said semiconductor layer separated from one another along a first direction and a second two regions separated from one another in a direction perpendicular to said first direction, said second two regions selectively overlapping said window;

removing said semiconductor layer where not masked by said second insulating layer;

forming channel stop regions on third two regions of said semiconductor layer over said first portion of substrate, said third regions being separated from one another in said perpendicular direction;

forming a thin insulating layer on said semiconductor layer over said first portion of said substrate, said thin insulating layer having a thickness suitable for establishing a channel region thereunder;

forming a gate electrode on said thin insulating layer;

selectively exposing a fourth two regions of said semiconductor layer by using said gate electrode and said thin insulating layer as a mask, said fourth regions being separated from one another in said first direction; and selectively incorporating an impurity of conductivity type opposite to said first conductivity type into said exposed third two regions, thereby providing said third two regions with a conductivity suitable for respective source and drain regions of said semiconductor device.

13. A process according to claim 12 comprising forming the surface of said substrate to have higher and lower portions, masking said higher portion of said substrate and selectively oxidizing said lower portion thereof, and forming said window by removing said mask from said higher portion, to provide said top surface of said first insulating layer with essentially the same level as that of said oxidized lower portion of said substrate.

14. A process for producing a semiconductor device according to claim 12 or 13 comprising forming said substrate to have a resistivity of from 0.5 to 2 ohm cm.

15. A process for producing a semiconductor device according to claim 12 or 13 comprising forming said first insulating layer to have a thickness of from 0.5 to 2 microns.

16. A process for producing a semiconductor device according to claim 12 or 13 comprising forming said semiconductor layer to have a thickness of from 0.5 to 1.5 microns, and forming said single-crystal part to have a body resistivity of from 0.5 to 50 ohm cm.

17. A process for producing the semiconductor device according to claims 12 and 13 comprising forming said polycrystalline part of said semiconductor layer to have a resistivity of from 18 to 20 ohm cm.

* * * * *

UNITED STATES PATENT AND TRADEMARK OFFICE
CERTIFICATE OF CORRECTION

PATENT NO. : 4,251,828

DATED : February 17, 1981  PAGE 1 OF 5

INVENTOR(S) : Junji Sakurai

It is certified that error appears in the above—identified patent and that said Letters Patent is hereby corrected as shown below:

Front page, [56] References Cited, "9/1977" should be --8/1977--.

\*Column 1, line 9, "the" should be --to a--;

\*line 10, "to a" should be --the--;

line 13, "N)" should be --N), henceforth P(N),--;

\*line 51, "cross sectional" should be --cross-sectional--;

line 59, "The the" should be --The--.

\*Column 2, line 4, after "therefore" delete ",";

\*line 8, "fore," should be --fore--;

\*line 10, delete ",";

\*line 13, after "comprising" insert --,--;

\*line 58, "cross sectional" should be --cross-sectional--.

Column 3, line 66, after "and" insert --which--.

Column 4, line 21, "with a" should be --with another--;

line 22, before "two" insert --these--;

\*lines 39, 41, 42 and 44, "cross sectional" should be --cross-sectional--;

line 45, "($a$)-($a$)" should be --(a)-(a)-- (no italics).

UNITED STATES PATENT AND TRADEMARK OFFICE
CERTIFICATE OF CORRECTION

PATENT NO. : 4,251,828

DATED : February 17, 1981

INVENTOR(S) : Junji Sakurai

It is certified that error appears in the above—identified patent and that said Letters Patent is hereby corrected as shown below:

*Column 5, lines 30 and 67, "ohm.cm." should be --ohm-cm.--;

*line 48, "too high" should be --too-high--.

*Column 6, line 12, "ohm.cm." should be --ohm-cm.--;

*"body resistivity $\rho_b$" should be --"body resistivity $\rho_b$"--;

line 40, after "direction" insert --,--;

*lines 43 and 53, "non masked" should be --non-masked--;

line 49, "layer;" should be --layer,--.

*Column 7, line 18, "non masked" should be --non-masked--;

line 48, "at" should be --at a--;

line 61, "and," should be --,--.

Figure 1A:
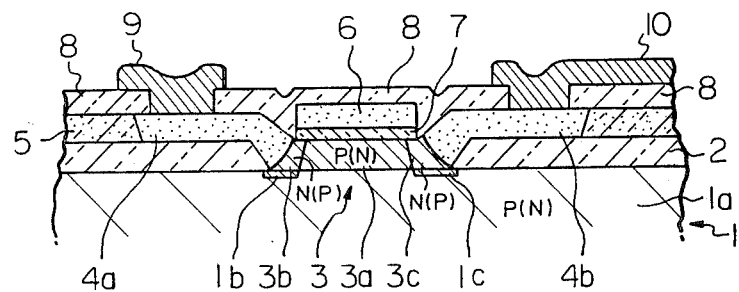
FIGS. 1a, b and c show a field effect transistor with a buried insulating layer.
Figure 1C:
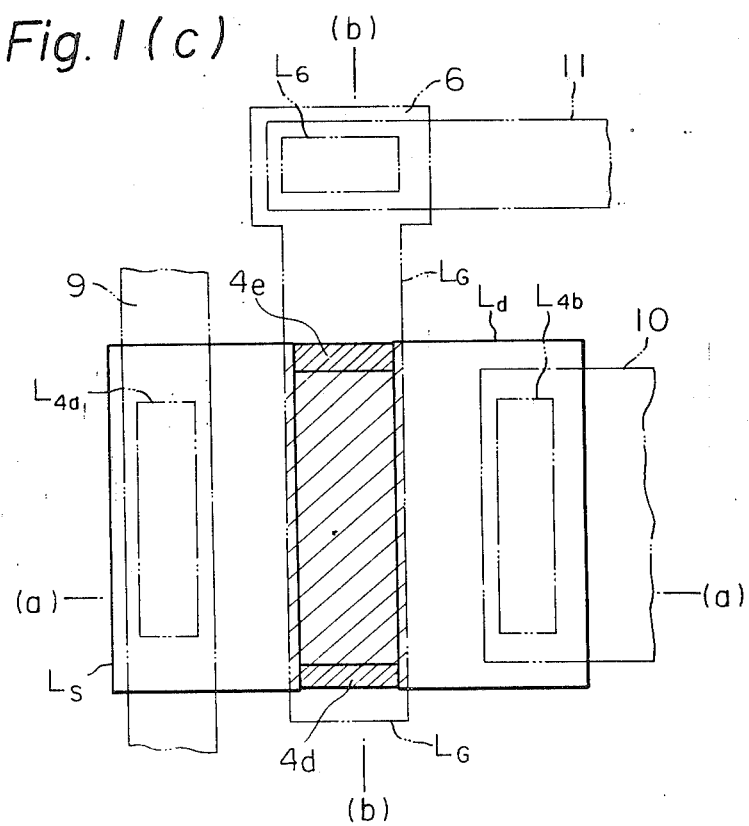
Figure 1:
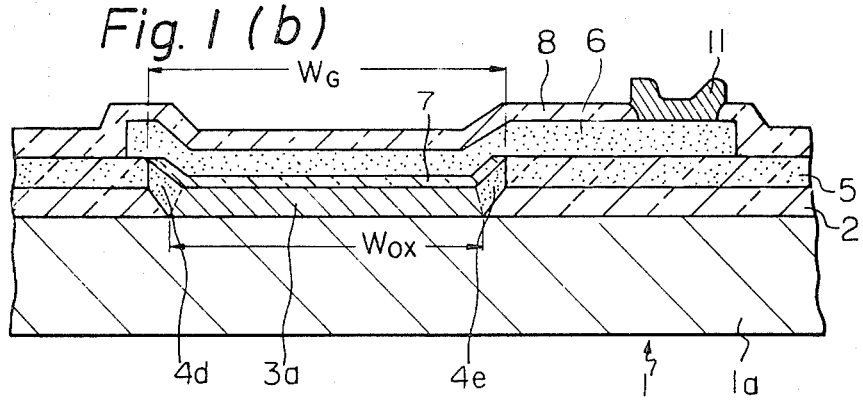
Figure 2:
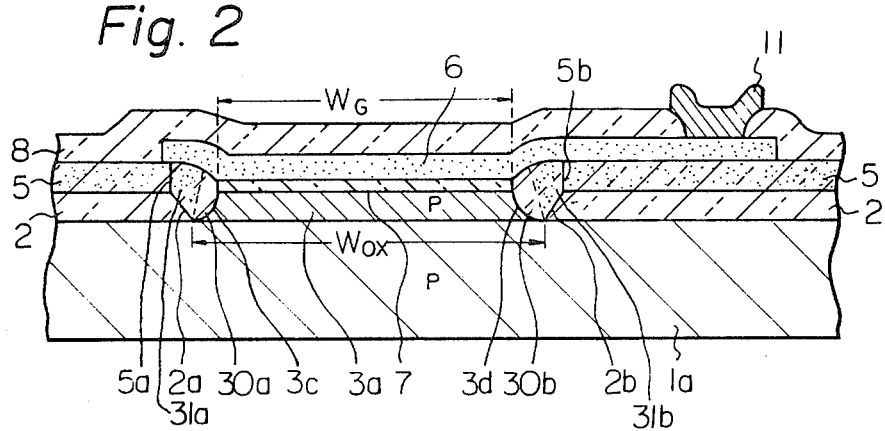
FIG. 2 shows in cross-section the structure of an MOS transistor according to the present invention.

*Column 8, line 15, "non masked" should be --non-masked--;

*line 19, "with" should be --as--;

*line 26, "FIGS. 1a, b and c" should be --FIGS. 1(a), (b) and (c)--;

*line 28, "cross-section" should be --cross section--;

line 30, "3(a)," should be --3,--; "10-14(a)" should be --10(a)-14(a)--;

*line 31, "cross sectional" should be --cross-sectional--;

*line 33, "cross" should be --cross- --;

*line 35, "invention, and;" should be --invention;--;

UNITED STATES PATENT AND TRADEMARK OFFICE
CERTIFICATE OF CORRECTION

PATENT NO. : 4,251,828

DATED : February 17, 1981

INVENTOR(S) : Junji Sakurai

It is certified that error appears in the above—identified patent and that said Letters Patent is hereby corrected as shown below:

*line 37, "tor." should be --tor; and--;

line 49, delete "to";

*line 67, "so called" should be --so-called--.

*Column 9, lines 7, 17, and 21, "non doped" should be
  --non-doped--;

line 9, "a carrier" should be --A carrier--;

line 11, "C." should be --C--;

line 20, "the" should be --an--;

*line 40, delete ",";

*line 43, delete "the";

*line 50, "now exposed" should be --now-exposed--.

Column 10, line 40, "otherhand," should be --other hand,--.

*Column 11, lines 4, 13, and 16, "phosphorous" should be
  --phosphorus--;

line 13, "C." should be --C--;

*line 14, "3c" should be --3c,--;

*line 40, "8" should be --8,--;

*line 42, "sourrounded" should be --surrounded--;

line 49, delete the first occurrence of "the";

*line 54, delete ",";

*line 56, "non masked first region" should be
  --non-masked first regions--;

UNITED STATES PATENT AND TRADEMARK OFFICE
CERTIFICATE OF CORRECTION

PATENT NO. : 4,251,828
DATED : February 17, 1981
INVENTOR(S) : Junji Sakurai

It is certified that error appears in the above—identified patent and that said Letters Patent is hereby corrected as shown below:

*line 61, "non exposed" should be --non-exposed--;

*line 64, "3c," should be --3c--.

*Column 12, line 3, "non exposed" should be --non-exposed--;

*line 16, "cross sectional" should be --cross-sectional--;

line 40, "C." should be --C--;

line 56, after "nitride" insert --layer--.

*Column 13, line 4, "non masked" should be --non-masked--;

line 26, "ion-impanted" should be --ion-implanted--;

line 35, "depostied" should be --deposited--;

*line 37, "phosphorous" should be --phosphorus--;

*line 58, "dioxide" should be --semiconductor--; delete "semiconduc-";

*line 59, "tor" should be --dioxide--;

*line 66, "Example." should be --example.--.

*Column 14, lines 9 and 16, "ohm.cm." should be --ohm-cm.--;

lines 11, 15, 18, 22, 24, 27, and 30, "C." should be --C--;

line 20, "and;" should be --and--;

*line 27, "phosphorous" should be --phosphorus--.

UNITED STATES PATENT AND TRADEMARK OFFICE
CERTIFICATE OF CORRECTION

PATENT NO. : 4,251,828
DATED : February 17, 1981
INVENTOR(S) : Junji Sakurai

It is certified that error appears in the above—identified patent and that said Letters Patent is hereby corrected as shown below:

Column 15, line 63, "or 1" should be --or 2--;
　　*after "2" insert --,--;
　　　　line 66, "or 1," should be --or 2,--.
*Column 16, line 10, "than," should be --than--;
　　　*lines 56 and 59, "claims" should be --claim--.

Signed and Sealed this

Twenty-second Day of September 1981

[SEAL]

Attest:

GERALD J. MOSSINGHOFF

Attesting Officer　　Commissioner of Patents and Trademarks